(12) United States Patent
Bidal et al.

(10) Patent No.: US 9,117,876 B2
(45) Date of Patent: Aug. 25, 2015

(54) INTEGRATED CIRCUIT COMPRISING AN ISOLATING TRENCH AND CORRESPONDING METHOD

(71) Applicant: STMicroelectronics (Crolles 2) SAS, Crolles (FR)

(72) Inventors: Grégory Bidal, Grenoble (FR); Laurent Favennec, Villard Bonnot (FR); Raul Andres Bianchi, Myans (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/447,699

(22) Filed: Jul. 31, 2014

(65) Prior Publication Data

US 2014/0342524 A1    Nov. 20, 2014

Related U.S. Application Data

(62) Division of application No. 13/495,919, filed on Jun. 13, 2012, now Pat. No. 8,829,622.

(30) Foreign Application Priority Data

Jun. 16, 2011  (FR) ..................... 11 55248

(51) Int. Cl.
  *H01L 21/336* (2006.01)
  *H01L 21/762* (2006.01)
  *H01L 29/51* (2006.01)
  *H01L 29/66* (2006.01)
  *H01L 21/28* (2006.01)
  *H01L 29/49* (2006.01)
  *H01L 29/78* (2006.01)

(52) U.S. Cl.
  CPC .... *H01L 21/76224* (2013.01); *H01L 21/28079* (2013.01); *H01L 21/76232* (2013.01); *H01L 29/513* (2013.01); *H01L 29/517* (2013.01); *H01L 29/518* (2013.01); *H01L 29/66477* (2013.01); *H01L 21/28088* (2013.01); *H01L21/28202* (2013.01); *H01L 29/4966* (2013.01); *H01L 29/78* (2013.01)

(58) Field of Classification Search
  CPC ................... H01L 21/76224; H01L 21/28079; H01L 21/76232; H01L 29/66477; H01L 29/4966; H01L 29/518
  USPC .......... 438/296, 592; 257/374, 368, 412, 506, 257/E29.02, E29.16, E21.179
  See application file for complete search history.

(56) References Cited

U.S. PATENT DOCUMENTS

| 6,838,374 | B2 | 1/2005 | Uenishi et al. |
| 2002/0074589 | A1 | 6/2002 | Benaissa et al. |
| 2003/0003644 | A1 | 1/2003 | Uenishi et al. |

(Continued)

FOREIGN PATENT DOCUMENTS

WO  WO 2011/036841 A1  3/2011

OTHER PUBLICATIONS

French Search Report and Written Opinion dated Oct. 12, 2011from corresponding French Application No. 11/55248.
European Search Report and Written Opinion dated Oct. 24, 2012from corresponding European Application No. 12305687.1.

*Primary Examiner* — Tu-Tu Ho
(74) *Attorney, Agent, or Firm* — Seed IP Law Group PLLC

(57) ABSTRACT

An integrated circuit including at least one isolating trench that delimits an active area made of a monocrystalline semiconductor material, the or each trench comprising an upper portion including an insulating layer that encapsulates a lower portion of the trench, the lower portion being at least partly buried in the active area and the encapsulation layer comprising nitrogen or carbon.

5 Claims, 4 Drawing Sheets

(56) References Cited

U.S. PATENT DOCUMENTS

| | | |
|---|---|---|
| 2004/0106261 A1 | 6/2004 | Huotari et al. |
| 2004/0251513 A1 | 12/2004 | Su et al. |
| 2008/0277726 A1 | 11/2008 | Doris et al. |
| 2008/0315288 A1 | 12/2008 | Kikuchi et al. |
| 2009/0224329 A1 | 9/2009 | Goto |
| 2013/0026546 A1 | 1/2013 | Favennec et al. |

INTEGRATED CIRCUIT COMPRISING AN ISOLATING TRENCH AND CORRESPONDING METHOD

CROSS REFERENCE TO RELATED APPLICATIONS

This application is a division of U.S. patent application Ser. No. 13/495,919, filed on Jun. 13, 2012, which claims the priority benefit of French patent application number 11/55248, filed on Jun. 16, 2011, which is hereby incorporated by reference to the maximum extent allowable by law.

BACKGROUND

1. Technical Field

Embodiments relate to the field of integrated circuits. More especially, embodiments relate to integrated circuits comprising isolating trenches that each delimit an active area made of a semiconductor material as well as the corresponding method for making them.

2. Discussion of the Related Art

The production of MOS transistors with a high-permittivity dielectric gate is known. Integrating a layer configured to adjust the work function of a gate into a gate of such a MOS transistor is also known.

FIGS. 1, 1AA and 1BB are, respectively, a top view, a cross-sectional view along plane AA in FIG. 1 and a cross-sectional view along plane BB in FIG. 1 of a MOS transistor 1 produced on and in a portion of a semiconductor substrate 2.

Substrate 2 comprises an isolating trench 4, commonly referred to as Shallow Trench Isolation (STI) that delimits an active area 6 made of monocrystalline silicon. On the front face 7 of substrate 2, there is a gate 8 that is isolated from the substrate by an insulating interface layer 10 made of silica. Gate 8 successively comprises a high-permittivity dielectric layer 12 made of hafnium oxide placed on layer 10, a lanthanum or magnesium layer 14 adapted in order to adjust the work function of the gate, a metal layer 16 made of titanium nitride and, finally, layer 18 made of polycrystalline silicon. Two spacers 20 are located on either side of gate 8.

In an effort to simplify the drawings, the source and drain areas of transistor 1 are not shown.

Once layer 14 has been formed, the lanthanum present in this layer 14 tends to diffuse during each of the subsequent stages that requires a certain thermal budget. The Applicant has, in particular, noted the occurrence of this diffusion phenomenon at a temperature of approximately 500° C. The lanthanum has a tendency to be absorbed by the oxygen reservoirs and to form compounds of the $La_2O_3$ or lanthanum silicate type. The concentration of lanthanum in layer 14 diminishes in an uncontrolled manner. This layer is therefore unable to continue fulfilling its function: this falsifies adjustment of the work function of the gate. Because the threshold voltage of a MOS transistor is proportional, in particular, to the work function of its gate, the operating characteristics of the transistor are thus modified and are no longer controlled.

The same applies if layer 14 comprises magnesium rather than lanthanum. The magnesium diffuses and seeks out oxygen reservoirs in order to form MgO type compounds.

The Applicant has also noticed this same affinity with oxygen when the lanthanum and magnesium are deposited respectively in the form of $La_2O_3$ and MgO.

SUMMARY

An embodiment provides an integrated circuit comprising an isolating trench that avoids some of the drawbacks of previous integrated circuits.

An embodiment provides an integrated circuit comprising MOS transistors having a controlled gate work-function.

An embodiment of the present invention is to provide a method for manufacturing an integrated circuit that mitigates at least some of the drawbacks of previous fabrication methods.

Thus, an embodiment makes provision for an integrated circuit comprising at least one isolating trench that delimits an active area made of a monocrystalline semiconductor material, further comprising at least one MOS transistor gate that is isolated from the active area by a gate insulation layer, upon which is successively deposited:

a layer comprising lanthanum, magnesium, aluminum or dysprosium, said layer being configured to adjust the work function of the gate, and a metal layer, the or each trench comprising an upper portion comprising an insulating layer that encapsulates a lower portion of the trench, the lower portion being at least partly buried in the active area and the encapsulation layer comprising nitrogen or carbon.

In another embodiment, the encapsulation layer comprises silicon oxynitride or silicon nitride.

In another embodiment, the encapsulation layer comprises silicon oxycarbide or silicon carbide.

In another embodiment, the encapsulation layer comprises two protruding elements arranged around the periphery of the layer.

An embodiment also makes provision for a method for manufacturing an integrated circuit in a monocrystalline semiconductor substrate, the circuit comprising at least one MOS transistor gate, that is isolated from the active area by a gate insulation layer, upon which is successively deposited:

a layer comprising lanthanum, magnesium, aluminum or dysprosium, said layer being configured to adjust the work function of the gate, and a metal layer, said method involving the following stages:

forming, in the substrate, at least one lower portion of an isolating trench that delimits an active area;

forming an insulating encapsulation layer comprising nitrogen or carbon with the insulating layer defining an upper portion of the isolating trench.

In another embodiment, the method also involves the following successive stages:

forming a gate insulation layer;

forming a layer configured to adjust the work function of the gate;

forming a layer of conductive material;

In another embodiment, the method also involves the following stage:

forming source and drain areas on either side of the gate.

In another embodiment, the insulating encapsulation layer is formed after the following stages:

depositing a layer comprising nitrogen or carbon;

performing photolithography;

partially etching the layer comprising nitrogen or carbon.

In another embodiment, the insulating encapsulation layer is formed after a nitrogen or carbon ion implantation stage.

In another embodiment, forming the insulating encapsulation layer of the isolating trench involves the following stages:

forming the encapsulation layer by depositing a compliant layer comprising nitrogen or carbon;

forming an insulating layer by depositing it on the encapsulation layer;

completely etching the insulating layer and the encapsulation layer so that part of the encapsulation layer covers the lower portion of the trench.

BRIEF DESCRIPTION OF THE DRAWINGS

These aspects, characteristics and advantages as well as others will be explained in detail in the following description of the particular embodiments, given merely by way of example and not limitatively, reference being made to the enclosed drawings wherein.

Previously described FIGS. 1, 1AA and 1BB are, respectively, a top view, a cross-sectional view along plane AA in FIG. 1 and a cross-sectional view along plane BB in FIG. 1 of a MOS transistor.

DETAILED DESCRIPTION

For the sake of clarity, identical elements are denoted by identical references in the various figures and, as is usual when representing integrated circuits, the various figures are not drawn to scale.

Figure 1:
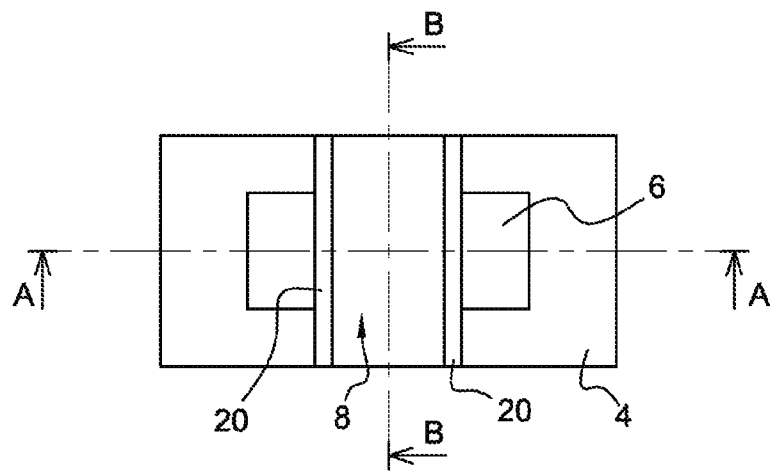
Figure 1A:
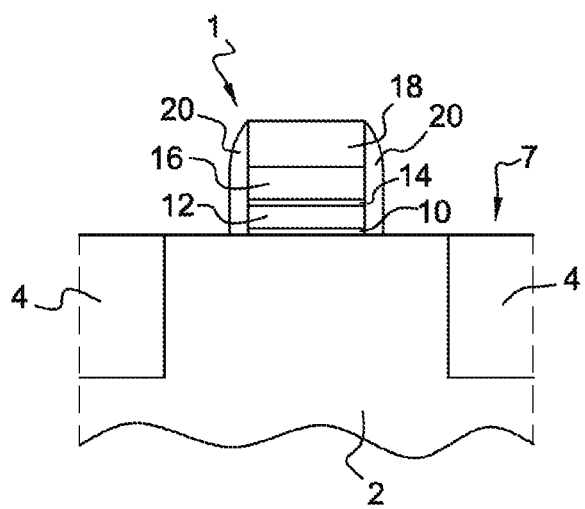

In FIGS. 1, 1AA and 1BB, note the presence of at least three oxygen reservoirs. The spacers made of silica constitute a first oxygen reservoir. During a stage subsequent to the formation of gate 8 and spacers 20 which requires a thermal budget, the lanthanum or magnesium in layer 14 diffuses naturally towards the spacers. This diffusion phenomenon is accentuated because spacers 20 are in direct contact with layer 14. In order to overcome this drawback, the spacers are advantageously made of silicon nitride.

Similarly, insulating interface layer 10 made of silica constitutes a second oxygen reservoir. In order to attenuate the diffusion of the lanthanum or magnesium in layer 14 into layer 10, one advantageously forms an insulating interface layer comprising an $SiO_xN_{1-x}$ type compound. x is preferably 0.1 to 0.5 and advantageously 0.1 to 0.2.

Figure 1B:
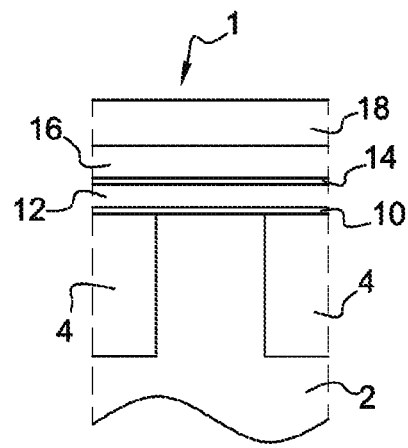

Isolating trench 4 formed from silica forms a third possible oxygen reservoir. As shown in FIG. 1BB, layer 14 is partly located above trench 4. This facilitates diffusion of the lanthanum or magnesium towards trench 4.

Figure 2:
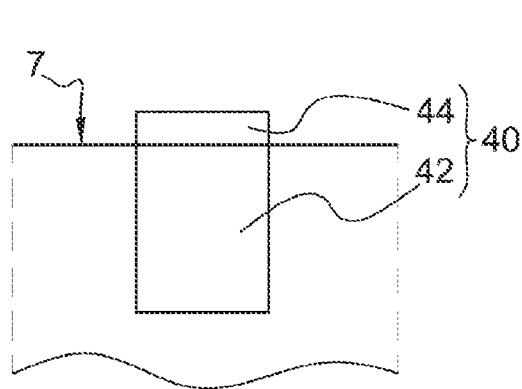
FIG. 2 is a cross-sectional view of an isolating trench in one embodiment of the invention.

FIG. 2 is a cross-sectional view of an isolating trench 40 located in substrate 2 which is made of an advantageously monocrystalline semiconductor material, e.g., silicon.

Trench 40 comprises a lower portion 42 and an upper portion 44. On lower portion 42, made of silica for example, namely on the same side as the front face 7 of substrate 2, there is an insulating encapsulation layer for the trench, with the insulating layer forming the upper portion 44. In FIG. 2, the lower portion is buried in the substrate. Provision can be made for this portion 42 to be only partially buried. In other words, part of portion 42 can protrude relative to the substrate.

The Applicant has noted that the presence of nitrogen or carbon in layer 44 slows down the diffusion of the lanthanum or magnesium that is present in the gate towards the oxygen reservoir comprising portion 42. The presence of nitrogen or carbon in layer 44 enables this layer to act as a shield between the gate and portion 42. This shield reduces the absorption of lanthanum or magnesium by portion 42 of trench 40. By way of example, layer 44 comprises silicon oxynitride (SiON) or silicon oxycarbide (SiOC). The higher the concentration of nitrogen (or carbon), the more effective the shield is. Advantageously, layer 44 comprises silicon nitride SiN (or silicon carbide SiC). Layer 44 has a thickness of 1 to 100 nm and preferably 2 to 10 nm.

By way of example, the method for forming layer 44 is as follows. One forms lower portion 42 of isolating trench 40 in substrate 2 by a photolithography process, followed by etching, followed by Chemical Vapor Deposition (CVD) of $SiO_2$. One then deposits an insulating layer comprising nitrogen (or carbon) over the entire front face 7 of substrate 2. This deposit can be obtained by CVD. Advantageously, deposition can be obtained by Low Pressure Chemical Vapor deposition (LPCV) or Rapid Thermal Chemical Vapor Deposition (RTCVD). One then performs a photolithography stage followed by etching in order to leave only that part of the insulating layer that is near the lower portion 42 of isolating trench 40. One has thus formed insulating encapsulation layer 44.

This example of the method involves using a resin which has a polarity that complements that of the resin used in order to produce the lower portion of trench 40. This resin is relatively unsuitable for a cleanroom environment. Alternatively, one can also envisage using a second complementary mask (relative to the first mask that is used to form portion 42) but this involves additional cost. One should also note the possibility of a problem in obtaining alignment with portion 42.

Advantageously, the Applicant suggests the following structure.

Figure 3:
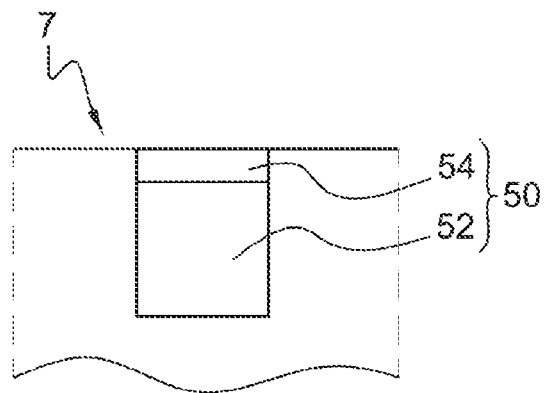
FIG. 3 is a cross-sectional view of an isolating trench in another embodiment of the invention.

FIG. 3 is a cross-sectional view of isolating trench 50 located in substrate 2.

Trench 50 comprises a lower portion 52 and an upper portion 54. The lower portion is buried in the substrate. Portion 54 comprises an insulating encapsulation layer. Note that the upper surface of encapsulation layer 54 just substantially touches the upper surface of front face 7. Alternatively, one can make provision for the upper surface of trench 50 to be either recessed or protruding relative to the upper surface of the front face 7 of substrate 2.

Lower portion 52 comprises, for example, silica. Layer 54 comprises nitrogen (or carbon). It may also comprise an SiON (or SiOC) type compound. It is advantageously made of silicon nitride (or SiC). Layer 54 has a thickness of 1 to 100 nm and preferably 2 to 10 nm. The presence of nitrogen (or carbon) in layer 54 limits the diffusion of lanthanum or magnesium towards the oxygen reservoir, namely towards lower portion 52.

One example of the method for producing layer 54 is as follows. One forms the isolating trench in substrate 2 (in the same way as one forms portion 42). After photolithography, one defines an opening at the level of the trench. One then performs nitrogen ion implantation in the silica that constitutes the trench. The implantation energy and quantity of dopants are chosen in order to form layer 54 on the surface in the upper portion of the trench. Layer 54 then constitutes a shield that prevents the lanthanum or magnesium from being absorbed in lower portion 52 of trench 50 which constitutes the oxygen reservoir.

During photolithography, there may be a problem in obtaining alignment of the resin relative to portion 52. Moreover, ion implantation may possibly cause damage to the active area.

The Applicant proposes the following method in order to improve the methods described above.

FIGS. 4A to 4F are cross-sectional views illustrating stages in an example of the method for manufacturing an isolating trench.

Figure 4A:
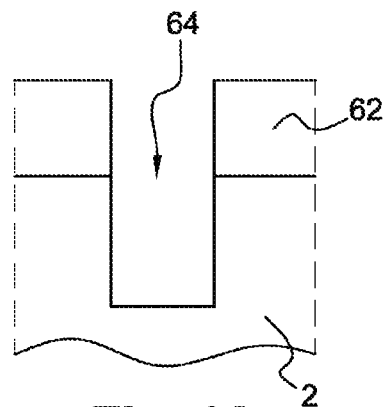
FIGS. 4A to 4F are cross-sectional views illustrating stages in the method for manufacturing an isolating trench according to one embodiment of the invention.

In FIG. 4A, an insulating layer 62 has been deposited on substrate 2, e.g., by using CVD. By way of example, layer 62 is made of $SiO_2$ and has a thickness of about 80 nm. One has then performed photolithography followed by etching in order to form a trench 64 in substrate 2.

Figure 4B:
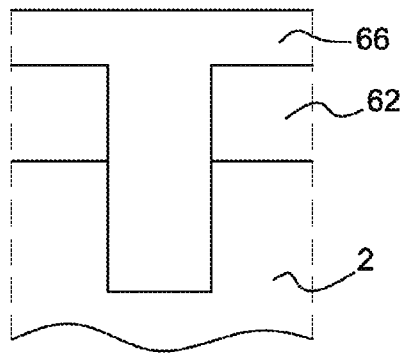

In FIG. 4B, an insulating layer 66 has been deposited in order to fill trench 64. This deposit can be obtained by CVD. By way of example, layer 66 is made of silica. Alternatively, one can thermally grow silica on the two lateral flanks and the bottom of substrate 2 that are exposed following the etching stage (described in relation to FIG. 4A). The purpose of this growth is to remedy any defects that appear after etching. By way of example, the layer obtained by growth is made of $SiO_2$ and has a thickness of about 0.4 nm. One then uses CVD to deposit silica in order to fill trench 64. One can then advantageously perform thermal annealing in order to densify the deposited oxide.

Figure 4C:
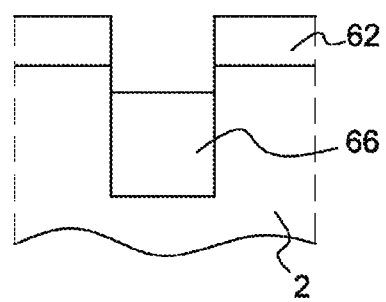

In FIG. 4C, a Chemical Mechanical Polishing (CMP) stage has been performed. This polishing stage stopped in layer 62. Layer 66 was then partially removed from trench 64 by cleaning using hydrofluoric acid for example. Wet etching of layer 66 stopped in trench 64. Alternatively, one can make provision to stop etching so that the upper surface of layer 66 just substantially touches the surface of the front face of substrate 2.

Figure 4D:
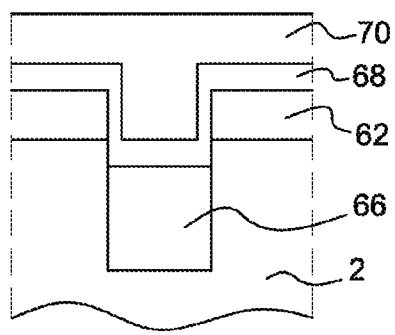

In FIG. 4D, an insulating layer 68 has been deposited on the front face of substrate 2. This layer is referred to as compliant and is a CVD or ALD (Atomic Layer Deposition) type layer. Layer 68 comprises nitrogen or carbon. Layer 68 has a thickness of about several nanometers. An insulating layer 70 has then been deposited, e.g., a CVD type layer. Layer 70 is made of $SiO_2$ for example.

Figure 4E:
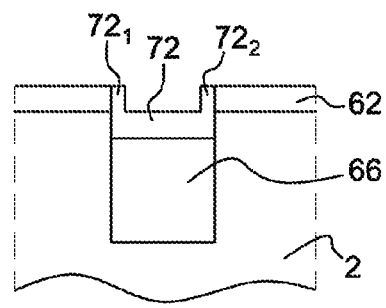

In FIG. 4E, a second CMP stage that stops in layer 62 has been performed. The remaining part of layer 68 forms encapsulation layer 72 for layer 66 located in the trench. Around the periphery of layer 72 and on its upper part, there are two protruding elements $72_1$ and $72_2$. These two elements, each forming a rib, are adjacent to layer 62. The remaining part of layer 70 has then been chemically etched, e.g. using hydrofluoric acid and phosphoric acid.

Figure 4F:
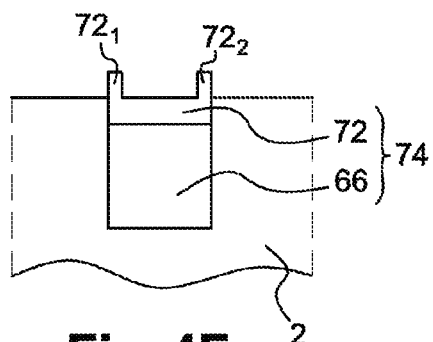

In FIG. 4F, the rest of layer 62 located on substrate 2 has been selectively etched. This then produces an isolating trench 74 comprising a lower portion 66 made of an insulating material buried in substrate 2 and encapsulated by the upper portion consisting of insulating layer 72 comprising nitrogen or carbon. The effect of the presence of the two protruding elements $72_1$ and $72_2$ is to extend the distance that the lanthanum or magnesium has to travel to reach the oxygen reservoir comprising the lower portion 66 of isolating trench 74. Diffusion is therefore limited.

Figure 4G:
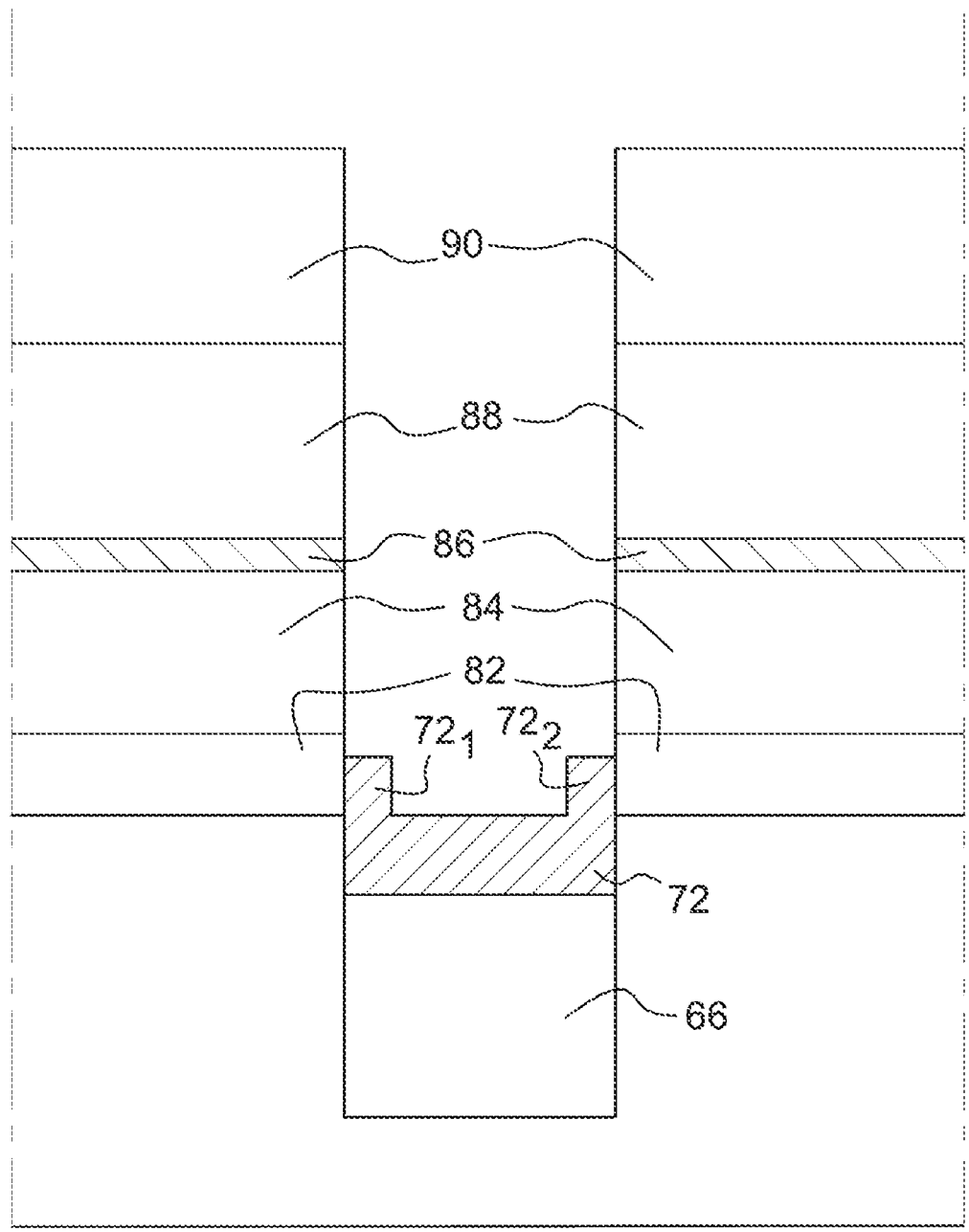
FIG. 4G is a cross-sectional view along plane BB of an isolating trench separating two distinct MOS transistors according to one embodiment of the invention.

This increase in the distance separating the lanthanum or magnesium layer and the oxygen reservoir is best illustrated in FIG. 4G, which depicts a cross-sectional view of an isolating trench along plane BB, separating two distinct MOS transistors. Each protruding element $72_1$ and $72_2$ of a trench extends into the lower insulating layer 82 of a MOS transistor along the edges of the STI.

Alternatively, one can make provision to etch the two protruding elements of the encapsulation layer so that the upper surface of layer 72 just substantially touches the upper surface of substrate 2.

Alternatively, one can make provision to deposit or grow a layer of silica on substrate 2 before depositing layer 62 which can then be made of SiN. In fact, the CMP stage (envisaged in FIG. 4C) stops more easily in an SiN layer than in an $SiO_2$ layer. Moreover, the layer of $SiO_2$ protects the silicon substrate during chemical etching of the SiN (using an $H_3PO_4$-based solution).

The nitrogen (or carbon) present in layer 72 significantly slows down the absorption of the lanthanum or magnesium in the lower portion 66 of the trench.

One can then form an isolated gate in substrate 2.

The three methods for forming the encapsulation layer for the lower portion of the trench are advantageously compatible with the CMOS methods used in microelectronics.

Figure 5:
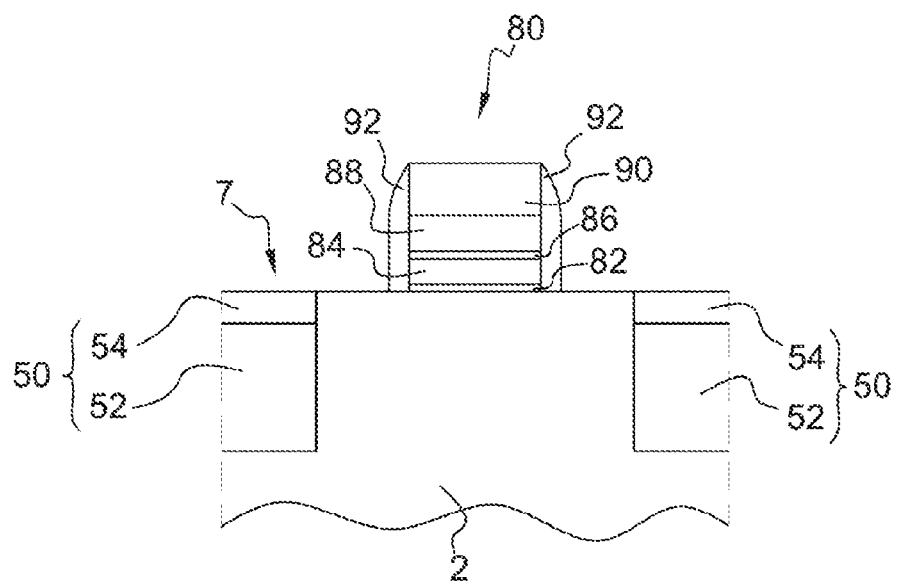
FIG. 5 is a cross-sectional view of an integrated circuit in one embodiment of the invention.

FIG. 5 is a cross-sectional view of an integrated circuit.

In substrate 2, there is an isolating trench 50. Alternatively, one can make provision to make an isolating trench 40, 74 or in accordance with the various embodiments described above. On the front face 7 of the substrate, namely in the active area delimited by the trench, there is a gate 80 of a MOS transistor. Gate 80 is insulated from the substrate by insulating interface layer 82 which comprises nitrogen, e.g. SiON. Alternatively, layer 82 may also comprise a bilayer comprising a layer of $SiO_2$ and a layer of SiON.

The gate comprises a high-permittivity dielectric layer 84 located on layer 82. By way of example but not limitatively, layer 84 is made of hafnium oxide, hafnium silicate or zirconium oxide. This layer 84 is advantageously formed by an ALD type process. The material of layer 84 is referred to as being of high permittivity because its dielectric constant is greater than the dielectric constant of the SiON and the $SiO_2$. A layer 86 of lanthanum, magnesium, aluminum or dysprosium is deposited on layer 84. This layer 86 is configured to adjust the work function of the gate. By way of example, layer 86 can be formed by Physical Vapor Deposition (PVD). To achieve this, one uses a target made of pure lanthanum or $La_2O_3$. Similarly, a target made of Mg or MgO is used in order to obtain a layer 86 made of magnesium. Alternatively, an ALD type process can be used.

The gate also comprises a metal layer 88 deposited, for instance, by a PVD type process. Layer 88 can be made of TiN, TaN or TaC. Finally, the gate comprises a layer 90 of polycrystalline silicon. One portion of layer 90 is intended to be silicided. On either side of gate 80 there are spacers 92 which are advantageously made of SiN. One then produces source and drain areas in order to obtain a MOS transistor.

This produces a transistor with optimized threshold voltage control. In fact, the constituents of layer 86 limit its diffusion towards the oxygen reservoirs constituted by spacers 92, interface layer 82 and isolating trenches 40, 50, 74.

Particular embodiments of the present invention have been described. Various alternatives and modifications will be within the grasp of those skilled in the art. In particular, one can make provision for carrying out nitrogen ion implantation for insulating layer 68. Substrate 2 can be a Silicon On Insulator (SOI) type substrate.

Various embodiments with different alternatives are described above. Note that those skilled in the art will be able to combine various features of these various embodiments and alternatives without thereby showing any inventiveness. In particular, the methods intended to obtain the devices shown in FIGS. 2, 3 and 4F can be combined.

Having thus described at least one illustrative embodiment of the invention, various alterations, modifications, and improvements will readily occur to those skilled in the art. Such alterations, modifications, and improvements are intended to be within the spirit and scope of the invention.

Accordingly, the foregoing description is by way of example only and is not intended as limiting. The invention is limited only as defined in the following claims and the equivalents thereto.

What is claimed is:

1. A method for manufacturing an integrated circuit in a monocrystalline semiconductor substrate, said circuit comprising at least one MOS transistor gate, that is isolated from the active area by a gate insulation layer, upon which is successively deposited:
   a layer comprising lanthanum, magnesium, aluminum or dysprosium, said layer being configured to adjust the work function of the gate,
   and a metal layer,
   said method involving the following stages:
   forming, in the substrate, at least one lower portion of an isolating trench that delimits an active area;
   forming an insulating encapsulation layer comprising nitrogen or carbon with the insulating layer defining an upper portion of the isolating trench, wherein forming the insulating encapsulation layer includes:
      forming the insulating encapsulation layer by depositing a compliant layer comprising nitrogen or carbon;
      forming an insulating layer by depositing it on the encapsulation layer; and
      completely etching the insulating layer and the encapsulation layer so that part of the encapsulation layer covers the lower portion of the trench.

2. The method as claimed in claim 1, which also involves the following successive stages:
   forming a gate insulation layer;
   forming a layer configured to adjust the work function of the gate;
   forming a layer of conductive material.

3. The method as claimed in claim 2, further comprising:
   forming source and drain areas either side of the gate.

4. The method as claimed in claim 1, wherein the insulating encapsulation layer is formed after the following stages:
   depositing a layer comprising nitrogen or carbon;
   performing photolithography;
   partially etching the layer comprising nitrogen or carbon.

5. The method as claimed in claim 1, wherein the insulating encapsulation layer is formed after a nitrogen or carbon ion implantation stage.

* * * * *